United States Patent
Tang et al.

(10) Patent No.: US 8,961,678 B2
(45) Date of Patent: Feb. 24, 2015

(54) ORGANIC SOLDERABILITY PRESERVATIVE AND METHOD

(71) Applicant: Rohm and Haas Electronic Materials LLC, Marlborough, MA (US)

(72) Inventors: Qin Tang, Fanling (HK); Kit Ho Tong, Howloon (HK); Chit Yiu Chan, Shatin (HK); Martin W. Bayes, Hopkinton (MA)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 238 days.

(21) Appl. No.: 13/722,768

(22) Filed: Dec. 20, 2012

(65) Prior Publication Data

US 2014/0174322 A1  Jun. 26, 2014

(51) Int. Cl.
| C09D 7/12 | (2006.01) |
| H01L 21/02 | (2006.01) |
| C23C 22/52 | (2006.01) |
| C23F 11/08 | (2006.01) |
| C23F 11/14 | (2006.01) |
| H05K 3/28 | (2006.01) |

(52) U.S. Cl.
CPC ........ *C09D 7/1233* (2013.01); *H01L 21/02304* (2013.01); *C23C 22/52* (2013.01); *C23F 11/08* (2013.01); *C23F 11/149* (2013.01); *H05K 3/282* (2013.01)
USPC .............. 106/287.18; 106/287.1; 106/287.19; 148/269; 228/211; 438/768

(58) Field of Classification Search
CPC ..... C09D 7/1233; C23C 22/52; C23F 11/491; H01L 21/0234
USPC ............. 106/287.1, 287.18, 287.19; 148/269; 228/211; 438/768
See application file for complete search history.

(56) References Cited

U.S. PATENT DOCUMENTS

| 3,933,531 | A | * | 1/1976 | Sawa et al. ..................... 428/470 |
| 5,089,304 | A | | 2/1992 | Kuder |
| 5,173,130 | A | * | 12/1992 | Kinoshita et al. .............. 148/268 |
| 5,362,334 | A | | 11/1994 | Adams et al. |
| 5,376,189 | A | | 12/1994 | Kukanskis |
| 5,658,611 | A | | 8/1997 | Ishido et al. |
| 5,795,409 | A | | 8/1998 | Hirao et al. |
| 6,524,644 | B1 | | 2/2003 | Wengenroth |
| 6,712,262 | B2 | | 3/2004 | Akaike et al. |
| 6,818,325 | B2 | * | 11/2004 | Mishima et al. .............. 428/690 |
| 6,824,891 | B2 | * | 11/2004 | Okada et al. .................. 428/690 |
| 2004/0048486 | A1 | * | 3/2004 | Bernards et al. .............. 438/710 |
| 2005/0064240 | A1 | * | 3/2005 | Mishima et al. .............. 428/690 |
| 2005/0173678 | A1 | | 8/2005 | Miura et al. |
| 2007/0221503 | A1 | | 9/2007 | Larson et al. |
| 2008/0163787 | A1 | | 7/2008 | Abys |
| 2012/0168075 | A1 | | 7/2012 | Abys et al. |
| 2012/0181922 | A1 | | 7/2012 | Kawamura et al. |
| 2013/0062581 | A1 | * | 3/2013 | May et al. ................... 252/519.3 |

FOREIGN PATENT DOCUMENTS

| EP | 0791671 B1 | 6/1997 |
| EP | 0627499 B1 | 7/1997 |
| JP | 06192851 | 7/1994 |
| JP | 07033766 | 2/1995 |
| JP | 09176524 | 7/1997 |
| WO | 2009117734 A1 | 9/2009 |

OTHER PUBLICATIONS

Michael Carano, The evolution of organic solderability preservatives (OSPs) from a temporary protectant to a leadership position in surface finishing chemistry, Circuit World, 2011, pp. 12-19, vol. 37, No. 2.
Denis P. Drolet, et al., FT-IR and XPS study of copper(II) complexes of imidazole and benzimidazole, Inorganic Chimica Acta, 1998, pp. 173-180, vol. 146.
C.R. Iordanescu, et al., Structure and morphology of Cu—Oxides films derives from PLD processes, Digest Journal of Nanomaterials and Biostructures, 2011, pp. 863-868, vol. 6, No. 2.
Shuduan Deng, et al., Two pyrazine derivatives as inhibitors of the cold rolled steel corrosion in hydorchloric acid solution, Corrosion Science, 2011, pp. 822-828, vol. 53.
Frank L. Muehlmann et al., Metabolite Analogs.V. Preparation of some substituted pyrazines and imidazo[b] pyrazines, J. Am. Chem. Soc., 1956, pp. 242-244, vol. 78, No. 1.

* cited by examiner

*Primary Examiner* — David M Brunsman
(74) *Attorney, Agent, or Firm* — John J. Piskorski

(57) ABSTRACT

An organic solderability preservative solution includes pyrazine derivatives which inhibit corrosion of metal. The solution is applied to metal surfaces of components for electronic apparatus to improve solderability of electrical connections between the components in the electronic apparatus.

5 Claims, No Drawings

ORGANIC SOLDERABILITY PRESERVATIVE AND METHOD

FIELD OF THE INVENTION

The present invention is directed to an organic solderability preservative and method for coating copper and copper alloy surfaces. More specifically, the present invention is directed to an organic solderability preservative and method for coating copper and copper alloy surfaces where the organic solderability preservative includes a pyrazine derivative.

BACKGROUND OF THE INVENTION

Copper and its alloys are the most commonly used metals in electronic applications such as providing conductive circuit paths for printed circuit boards (PCBs). PCBs require electronic components to be attached to copper or copper alloy surface pads or through-holes by a soldering operation. Leaded components can be inserted into through-holes followed by wave soldering, or surface mount technology (SMT) components can be attached to surface pads by applying solder paste to the surface, for example by screen printing, then placing the component onto paste followed by reflow soldering. For SMT assembly operations a minimum of two reflow cycles are required in order to attach components to both the front and back of the PCB. For more complex assemblies additional reflow operations may be required to attach additional components or to carry out repair operations.

The copper surfaces of PCB pads to which components are mounted are typically coated with a protective metallic or non-metallic finish. Such protective finishes are designed to maintain good solderability by preventing the copper surface from being oxidized either during storage after PCB fabrication or during exposures to soldering temperatures.

There are several methods by which protective finishes can be applied to PCBs: by electrolytic, electroless or immersion deposition of a metal from solution, or by immersion treatment in either a solution which deposits a protective organic solderability preservative (OSP), or in a bath of molten solder alloy in a process known as Hot Air (Solder) Leveling (HAL/HASL).

OSP is considered to be a low cost SMT-compatible non-metallic surface finish method due to the excellent surface co-planarity of the coated pads. OSPs used in the current PCB industry are predominantly based on azole compounds, such as imidazoles, benzimidazoles and their derivatives.

All these N-heterocyclic compounds adsorb on copper surfaces via the formation of coordination bonds with copper atoms and have the capability to form thicker films through formation of copper-N-heterocyclic complexes. OSP film formation is preferred to be copper-specific with much lower rates of film formation on gold or other surfaces in order to prevent contamination of these substrates during the film formation process on copper. In general, OSP coating thickness is from 80-500 nm. Thinner coatings tend to lower the protectiveness against oxidization of copper surfaces, while thicker coatings tend to result in the deterioration of solderability.

The ability of OSP process to continue to evolve generation by generation to meet increasingly severe performance requirements resides in the diversity of derivatives of N-heterocyclic compounds that have been synthesized. At the present time azole compounds for OSP processes have gone through at least five generations.

An Enthone copper tarnish prevention product, ENTEK CU-56, based on benzotriazole, was first used as an OSP in the 1960's. See *Soldering and Surface Mount Technology*, 7(2), 6-9, 1995. The thickness of the benzotriazole film formed on copper was low, usually less than 10 nm. In addition, the decomposition temperature of the benzotrizaole-copper complex was low, i.e., around 75° C. and the protective layer typically only tolerated a single tin-lead thermal reflow cycle.

Second generation using substituted imidazoles as the active component was introduced in 1977. See U.S. Pat. No. 3,933,531. These materials formed OSP films with thicknesses above 0.2 microns but had relatively poor stability at higher temperatures.

The third generation of OSP compounds using benzimidazoles where a benzene ring is fused to the imidazole ring was introduced in 1990-1991. See U.S. Pat. No. 5,173,130. Benzimidazoles have been widely used as the main component in many commercial OSP products by a number of companies in the PCB industry. Benzimidazoles form complexes with copper very efficiently with film thicknesses which range from 10 to 100 nm. The thickness can be further increased to 500 nm to 600 nm by adding metal ions into the working solution. However, the deposition selectivity of benzimidazoles was still poor and OSP coatings formed on gold surfaces in selective electroless nickel immersion gold (ENIG) processes.

Owing to the complicated panel design technology, more reflow cycles were required to attach additional components and to carry out re-work operations. Accordingly, further improvement on thermal stability of the OSP coatings was needed. A fourth generation of OSPs was developed. These were substituted benzimidazoles, such as 2-substituted benzimidazoles, and were introduced into the industry in 1997. The thermal resistance of the OSP was greatly improved by introducing the substituted group to the benzimidazole ring. The decomposition temperature of such organic-copper complexes was significantly higher, i.e., around 350° C., resulting in extremely high film stability on copper at thicknesses in the range 100-300 nm.

Several different approaches have been used by suppliers to reduce OSP film formation on gold surfaces. In 2003 Wengenroth patented the use of benzimidazole derivatives containing pre-dip compositions which accelerate subsequent OSP film formation on copper surfaces. The accelerated film formation allowed the use of lower concentrations of active material in the main OSP bath, thus reducing the film formation on gold surfaces. Approaches based on modification to the main bath formation have also been found to be effective with Shikoku commercializing several products based on the use of an iron additive.

The shift towards lead-free soldering in the PCB assembly industry that had emerged in Japan in the 1990's was accelerated by the requirements of the 2003 European Union RoHS Directive. This forced a shift in soldering processes to lead-free alloys which require about 30° C. higher peak reflow temperatures than tin lead alloys. Driven by this increase in peak reflow temperatures, a fifth generation of OSPs was developed using aryl-phenyl imidazoles as the active components. Both the thermal stability and deposition selectivity of these OSPs was improved. Although there are now a wide variety of OSP products based on azole compounds, such as imidazoles, benzimidazoles and their derivatives, there remains a need to improve the performance of OPS compositions and methods.

SUMMARY OF THE INVENTION

Compositions include one or more sources of metal ions chosen from copper salts, tin salts, zinc salts, silver salts, nickel salts, lead salts, barium salts, manganese salts, iron salts and palladium salts, one or more acids and one or more compounds having formulae:

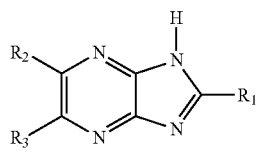

I wherein $R_1$, $R_2$ and $R_3$ are independently hydrogen, halide, nitro, hydroxyl, cyano, substituted or unsubstituted, linear, branched or cyclic hydrocarbyl, substituted or unsubstituted, linear or branched alkoxyl, carboxyl, ester, mercapto, alkylthio, thioester, amino, amide, boryl or silyl; $R_1$ and $R_2$ may be taken together with all of their atoms to form a five membered heterocyclic ring wherein the heterocyclic ring includes two nitrogen atoms as the hetero-atoms; and $R_1$ may have the following structure:

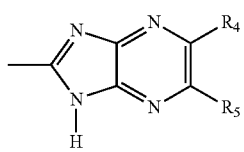

II wherein $R_4$ and $R_5$ are independently hydrogen, halide, nitro, hydroxyl, cyano, substituted or unsubstituted, linear, branched or cyclic hydrocarbyl, substituted or unsubstituted, linear or branched alkoxyl, carboxyl, ester, mercapto, alkylthio, thioester, amino, amide, boryl or silyl; $R_4$ and $R_5$ may be taken together with all of their atoms to form a five membered heterocyclic ring wherein the heterocyclic ring includes two nitrogen atoms as the hetero-atoms.

Methods include providing a substrate including copper or copper alloy; and contacting the substrate with a composition including one or more sources of metal ions chosen from copper salts, tin salts, zinc salts, silver salts, nickel salts, lead salts, barium salts, manganese salts, iron salts and palladium salts, one or more acids and one or more compounds having structure:

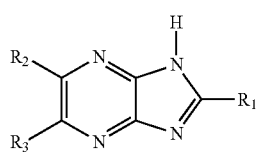

I wherein $R_1$, $R_2$ and $R_3$ are independently hydrogen, halide, nitro, hydroxyl, cyano, substituted or unsubstituted, linear, branched or cyclic hydrocarbyl, substituted or unsubstituted, linear or branched alkoxyl, carboxyl, ester, mercapto, alkylthio, thioester, amino, amide, boryl or silyl; $R_2$ and $R_3$ may be taken together with all of their atoms to form a five membered heterocyclic ring wherein the heterocyclic ring includes two nitrogen atoms as the hetero-atoms; and $R_1$ may have the following structure:

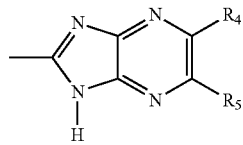

II wherein $R_4$ and $R_5$ are independently hydrogen, halide, nitro, hydroxyl, cyano, substituted or unsubstituted, linear, branched or cyclic hydrocarbyl, substituted or unsubstituted, linear or branched alkoxyl, carboxyl, ester, mercapto, alkylthio, thioester, amino, amide, boryl or silyl; $R_4$ and $R_5$ may be taken together with all of their atoms to form a five membered heterocyclic ring wherein the heterocyclic ring includes two nitrogen atoms as the hetero-atoms to form a coating on the copper or copper alloy of the substrate.

The compositions and methods enable the formation of a continuous and substantially uniform organic film on copper and copper alloy surfaces. The film has good anticorrosion properties and thermal stability and retains solderability of copper and copper alloy surfaces even after multiple heat cycles. Alternatively, the compositions can be used as a pre-dip which is applied to the copper or copper alloy prior to application of one or more conventional OSP compositions. The pre-dip enhances the final protective coating on the copper or copper alloy.

DETAILED DESCRIPTION OF THE INVENTION

As used throughout this specification, the abbreviations given below have the following meanings, unless the context clearly indicates otherwise: g=gram; mL=milliliter; L=liter; cm=centimeter; nm=nanometers; min.=minute; ppm=parts per million; ° C.=degrees Centigrade; RT=room temperature; RO=reverse osmosis water; mol=moles; g/L=grams per liter; OSP=organic solderability preservative; ORL0=organic flux without halide; ROL0=rosin flux without halide; FTIR (ATR-FTIR)=attenuated total reflection Fourier transformed infrared spectroscopy; FIB=focused ion beam spectroscopy; XPS=X-Ray photoelectron spectroscopy; $^1$H-NMR=proton nuclear magnetic resonance; B=element boron; Si=element silicon; and wt %=percent by weight.

The terms "printed circuit board" and "printed wiring board" are used interchangeably throughout this specification. The terms "plating" and "deposition" are used interchangeably throughout this specification. The terms "structure" and "formula" are used interchangeably throughout the specification. The terms "a" and "an" refer to both singular and the plural. All amounts are percent by weight, unless otherwise noted. All numerical ranges are inclusive and combinable in any order except where it is logical that such numerical ranges are constrained to add up to 100%.

The compositions may be used as organic solderability preservatives in the manufacture of electronic components such as printed circuit boards. The compositions are applied to copper or copper alloy surfaces of the substrate to coat and protect them from oxidation during storage prior to assembly and during subsequent attachment of electronic components during assembly operations. The compositions are aqueous based and exclude organic solvents. Compositions include one or more compounds having structure:

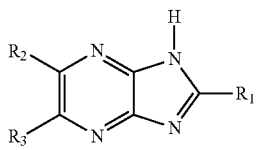

I wherein $R_1$, $R_2$ and $R_3$ are independently hydrogen, halide, nitro, hydroxyl, cyano, substituted or unsubstituted, linear, branched or cyclic hydrocarbyl, substituted or unsubstituted, linear or branched alkoxyl, carboxyl, ester, mercapto, alkylthio, thioester, amino, amide, boryl or silyl; $R_1$ and $R_2$ may be taken together with all of their atoms to form a five membered heterocyclic ring wherein the heterocyclic ring includes two nitrogen atoms as the hetero-atoms; and $R_1$ may have the following structure:

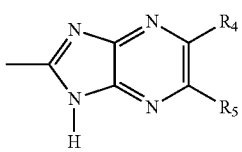

II wherein $R_4$ and $R_5$ are independently hydrogen, halide, nitro, hydroxyl, cyano, substituted or unsubstituted, linear, branched or cyclic hydrocarbyl, substituted or unsubstituted, linear or branched alkoxyl, carboxyl, ester, mercapto, alkylthio, thioester, amino, amide, boryl or silyl; $R_4$ and $R_5$ may be taken together with all of their atoms to form a five membered heterocyclic ring wherein the heterocyclic ring includes two nitrogen atoms as the hetero-atoms.

When $R_2$ and $R_3$ are taken together to form a five membered heterocyclic ring, compounds have structure:

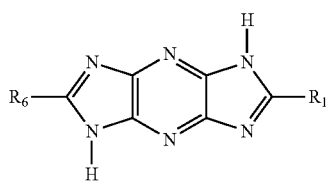

III wherein $R_1$ is defined as above and $R_6$ is the same as $R_1$ with the proviso that $R_6$ is not a structure as formula II above.

When $R_1$ of structure I is structure II as defined above, the structure is as follows:

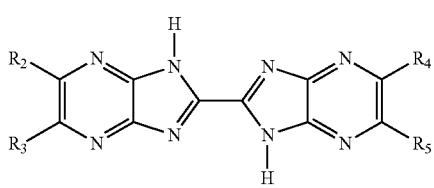

IV wherein $R_2$, $R_3$, $R_4$ and $R_5$ are as defined above.

When $R_4$ and $R_5$ are taken together to form a five membered heterocyclic ring the structure is as follows:

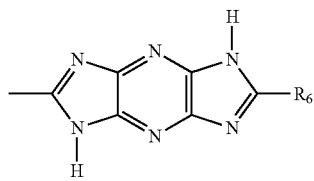

V wherein $R_6$ is as defined above.

Hydrocarbyl typically has from one to twenty-five carbon atoms, preferably from one to twelve carbon atoms, more preferably from one to seven carbon atoms. The hydrocarbyl may be methyl, ethyl, n-propyl, isopropyl, n-butyl, isobutyl, tert-butyl, pentyl, hexyl, heptyl, phenyl or benzyl. Substituents on substituted hydrocarbyl include, but are not limited to nitro, amino, halide, cyano, carbonyl, carboxyl, hydroxyl and alkoxyl. Halides include fluoride, chloride and bromide, typically the halide is chloride and fluoride, more typically the halide is chloride.

Substituted or unsubstituted, linear or branched alkoxyl and substituted or unsubstituted, linear or branched amino and amide may have from one to twenty-five carbon atoms, preferably from one to twelve carbon atoms and more preferably from one to six carbon atoms. Substituents on the substituted alkoxyl and substituted amino and amide include but are not limited to, nitro, amino, halide, cyano, carbonyl, carboxyl, hydroxyl and alkoxyl.

Substituted or unsubstituted linear or branched carboxyl and carbonyl may have from one to twenty-five carbon atoms, preferably from one to twelve carbon atoms and more preferably from one to six carbon atoms. Substituents include, but are not limited to nitro, halide and hydroxyl.

Substituted or unsubstituted linear or branched ester and thioester may have from two to twenty-five carbon atoms, preferably from two to twelve carbon atoms and more preferably from two to six carbon atoms. Substituents include, but are not limited to, nitro, halide, hydroxyl and cyano.

Substituted or unsubstituted linear or branched alkylthio groups may have from one to twenty-five carbon atoms, preferably from two to twelve carbon atoms and more preferably from two to six carbon atoms. Substituents include, but are not limited to, nitro, halide, hydroxyl and cyano.

Boryl has the following structure:

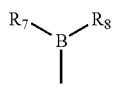

VI wherein $R_7$ and $R_8$ are independently hydrogen, substituted, unsubstituted, linear or branched alkyl groups having from one to ten carbon atoms preferably from one to five carbon atoms, most preferably $R_7$ and $R_8$ are hydrogen. Substituents include, but are not limited to, nitro, hydroxyl and halide.

Silyl has the following structure:

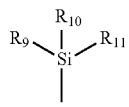

VII wherein $R_9$, $R_{10}$ and $R_{11}$ are independently hydrogen, or substituted, unsubstituted, linear or branched one to five carbon alkyl; or phenyl. Preferably $R_9$, $R_{10}$ and $R_{11}$ are from one to four carbon alkyl groups or phenyl. Examples of such silyl groups are trimethyl silyl, tert-butyldiphenyl silyl, tert-butyl dimethyl silyl and triisoprpoyl silyl. Substituents include, but are not limited to halide, nitro and hydroxyl.

Preferably $R_1$, $R_2$ and $R_3$ are independently hydrogen, hydroxyl, substituted or unsubstituted, linear or branched alkyl or alkoxy with one to six carbon atoms. Substituents on the alkyl and alkoxy include, but are not limited to, hydroxyl, carboxyl, amino and carbonyl. More preferably $R_1$, $R_2$ and $R_3$ are independently hydrogen, hydroxyl, substituted or unsubstituted, linear or branched alkyl with one to five carbon atoms where the substituents include, but are not limited to, hydroxyl and amino Most preferably, $R_1$, $R_2$ and $R_3$ are independently hydrogen, hydroxyl or hydroxyalkyl having one to five carbon atoms. Even more preferred are when $R_1$, $R_2$ and $R_3$ are hydrogen.

The pyrizine derived compounds having the foregoing structures may be included in the compositions in amounts of 0.5 g/L to 15 g/L, preferably from 1 g/L to 12 g/L, more preferably from 2 g/L to 10 g/L. Such compounds may be commercially obtained or they may be made according to processes known in the art or disclosed in the literature.

The compositions also include one or more acids, preferably, organic acids, to adjust the pH of the compositions to a range of 1-6, preferably from 1-5, more preferably from 2-4. Inorganic acids include, but are not limited to hydrochloric acid, sulfuric acid, nitric acid, phosphoric acid and hydrofluoric acid. Organic acids include, but are not limited to, carboxylic acids and their salts. Such carboxylic acids include, but are not limited to, acetic acid, citric acid tartaric acid, ascorbic acid, malic acid, formic acid and salts thereof. In general, inorganic and organic acids are included in the compositions in amounts of 0.1 g/L to 10 g/L; however, the amount may vary since the acids are included in sufficient amounts to maintain the desired pH.

One or more sources of metal ions are also included in the compositions. Metal ions are included to increase the rate of film formation, provide for a more uniform film layer and also lower operating temperatures of the compositions. Such metal ions include, but are not limited to copper, tin, zinc, silver, nickel, lead, manganese, barium, palladium and iron. Preferably the metal ions are chosen from copper, tin, zinc, silver, manganese, iron and nickel. More preferably the metal ions are chosen from copper, zinc, tin and nickel. Most preferably the metal ions are chosen from copper and zinc. Sources of the metal ions may include any water soluble organic or inorganic metal salt such as water soluble metal salts of halides, nitrates, acetates, sulfates, oxides, alkylsulfonates, formates, gluconates, tartrates, oxalates, acetates and lactates. Many of such metal salts are commercially available or may be made based on disclosures in the literature. In general such salts are included in the compositions in amounts of 0.001 g/L to 5 g/L, preferably from 0.01 g/L to 2 g/L. Such salts are added in amounts to provide metal ions at concentrations of 1 ppm to 5000 ppm, preferably from 10 ppm to 2000 ppm.

Optionally one or more complexing or chelating agents can be included in the composition. Conventional complexing or chelating may be used. Such complexing or chelating agents include, but are not limited to, carboxylic acids, such as acetic acid, formic acid, nitrilo-triacetic acid, tartaric acid, gluconic acid, phthalic acid, citric acid, ethylenediaminetetraacetic acid (EDTA) and N-(2-hydroxyethyl)ethylenediamine-N,N', N''-triacetic acid trisodium salt (HEDTA), carboxylic acid-substituted N-containing heterocyclic compounds, such as picolinic acid, quinolinic acid, nicotinic acid, fusaric acid, isonipecotic acid, pyridine dicarboxylic acid, piparazine carboxylic acid, pyrrole carboxylic acid and pyrolidine; amino carboxylic acids include, but are not limited to polyamines, amino alcohols, such as ethanolamine and dimethylethanolamine; sulfur containing compounds, such as thiols, disulfides, thioethers, thioaldehydes, thioketones, thiourea and its derivatives, thioglycols, mercaptoacetic acid, mercaptopropionic acid and mercaptosuccinic acid; amines such as ethylenediamine and ammonia; and amino acids, such as glutamic acid, aspartic acid, lysine, histidine, alanine, glycine, glutamine, valine, cysteine and methionine.

Prior to applying the composition to the copper or copper alloy surface of the substrate, the metal surface is typically cleaned or etched or cleaned and etched to remove any organic contamination and surface oxidation. Suitable cleaners include acid compositions such as those that include hydrochloric acid, sulfuric acid, citric acid and basic surface treatments such as those which include sodium hydroxide, sodium bicarbonate and sodium carbonate. Such cleaning compositions may contain wetting agents or other components disclosed in the published literature. Such cleaning is typically done for 5-10 minutes at room temperature. The substrate is then optionally rinsed with water and then micro-etched with an oxidizing agent containing solution to roughen the surface. Such oxidizing agents are well known in the art and in the literature. An example of an oxidizing agent is sodium persulfate in aqueous sulfuric acid. Etching is typically done at room temperature to 30° C. from 0.5 to 2 minutes. The substrate may be rinsed and dried.

The OSP composition may then be applied to the metal by any suitable process known in the art. Such processes include, but are not limited to, dipping the substrate into the composition, spraying the composition onto the substrate or by brushing the composition on the substrate. In general, the OSPs are applied at temperatures from room temperature to 90° C., preferably from 30° C. to 70° C. Contact time between the substrate and the OSP prior to the next processing step may range from one minute to 10 minutes, preferably from one minute to 5 minutes. Optionally the coated substrate may be air dried at room temperature and then the substrate may be rinsed with water at room temperature followed by hot air drying at temperatures of 50-70° C. The dried film on the metal surface typically forms a uniform layer 80 nm to 400 nm thick, more typically from 100 nm to 300 nm thick. Most typically the dried film has a thickness of 100 nm to 200 nm.

The compositions and methods may be used to form OSPs anticorrosion films on copper and copper alloys. Copper alloys include, but are not limited to copper/tin, copper/zinc, copper/tin/zinc, copper/tin/silver and copper/nickel. Preferably, the OSPs are applied to copper. Although the OSPs are typically used in the manufacture of printed circuit boards, they may be used on other copper and copper alloy containing substrates where corrosion inhibition is a problem.

A soldering process may follow application of the OSP. Any suitable soldering process may be used. Soldering may be done by heating, vapor phase, laser, plasma, oven melting, or passing an electrical current through soldering metals or metal alloys, or by any other method of heating the soldering metals and metal alloys above their liquidus temperature. Typically a tin-lead or lead-free soldering process is used.

In an alternative embodiment the compositions containing the pyrazine derivatives may be used as a pre-dip or pretreatment composition prior to applying a conventional OSP to the copper or copper alloy. The pre-dip is applied to the copper or copper alloy after etching with the oxidizing agent to coat the metal. The substrate may be optionally rinsed after etching. The pre-dip is applied to the metal for 10 seconds to 5 minutes, preferably from 15 seconds to 2 minutes. The pre-dip is applied at temperatures from room temperature to 90° C., preferably from room temperature to 60° C. Optionally the substrate is rinsed and then the conventional OSP is applied to the metal as described above. Conventional OSP formulations may include triazoles, imidazoles and benzimidazoles. Examples of such formulations are disclosed in U.S. Pat. No. 5,362,334; U.S. Pat. No. 5,376,189 and U.S. Pat. No. 5,658, 611. The substrates then undergo soldering as described above.

The compositions and methods enable the formation of a continuous and substantially uniform organic film on metal surfaces. The film has good anticorrosion properties and thermal stability and retains solderability of copper and copper alloy surfaces even after multiple heat cycles.

The following examples are not intended to limit the scope of the invention but to further illustrate it.

Example 1

1-H-imidazole[4,5-b]pyrazine compound was prepared by mixing two grams of 2,3-diaminopyrazine and 10 mL of triethyl orthoformate then refluxing at 140-145° C. for 2 hours under nitrogen. The reaction mixture was cooled, filtered and washed with hexane. The solid obtained was dissolved in 10 mL of 10% sodium hydroxide solution at 100° C. for 10 minutes and filtered while hot. 10 mL of acetic acid was added to the filtrate which was then stored overnight at room temperature. Light brown crystals were collected by filtration with a yield of 75% or 1.64 g. See J. Am. Chem. Soc., 78, 242-244, 1956. The product was confirmed to be 1-H-imidazole[4,5-b]pyrazine recrystallized from acetic acid using $^1$H-NMR (Brucker ADVANCE III 400 MHz) and mass spectrometry (Thermo Finnigan MAT 95XL).

Example 2

An OSP solution was made as described below.

TABLE 1

| Chemicals | Amounts |
| --- | --- |
| Acetic acid | Adjust pH |
| 1-H-imidazole[4,5-b]pyrazine | 0.0413 mol/L |
| Copper (II) chloride (dihydrate) | 0.0016 mol/L |
| Bath pH | 2.5 |

The working bath which had 5 g/L 1-H-imidazole[4,5-b] pyrazine and 100 ppm copper ions was prepared as follows:
1. 1 g 1-H-imidazole[4,5-b]pyrazine prepared according to the method described in Example 1 was dissolved in 250 mL beaker with 100 ml RO water;
2. The solution was stirred until the solid dissolved (mixture A);
3. The pH of mixture A was adjusted to 2.5 with 50% acetic acid;
4. A 10 g/L copper (II) chloride dihydrate solution was prepared in a volumetric flask and then 2 mL of this copper chloride solution was transferred into mixture A; and
5. Sufficient amount of RO water was added to mixture A to bring the volume to 200 mL.

Three FR-4 copper clad laminates obtained from Fastprint China were treated with the OSP bath and according to the process disclosed in Table 2 below.

TABLE 2

| Step | Process Bath | Conditions |
| --- | --- | --- |
| Cleaner | RONACLEAN ™ LP-200 Acid Cleaner | 50° C., 5 min |
| Water Rinse | — | RT, 2 min |
| Micro-etch | 100 g/l Sodium Persulfate 20 ml/l $H_2SO_4$ | 25° C., 1 min |
| RO Rising | — | RT, 2 min |
| Cold air dry | — | — |
| OSP Deposition | OSP bath | 50° C., 3 min |
| Cold air dry | — | RT |
| RO Rinse | — | RT, 2 min |
| Hot air dry | — | 50-70° C. |

Two of the laminates were then reflowed. One laminate was reflowed 5× and the other laminate was reflowed 11×. A MALCOM™ desk top reflow oven was used with a peak temperature of 255° C. Ramping rates were 40° C. to 200° C.=1° C./second and 200° C. to 250° C.=1.3° C./second. The reflow parameters and procedure were as described in Table 3.

TABLE 3

| Process Steps | Temperature | Requirement on Solder Paste Specification | Measured Condition |
| --- | --- | --- | --- |
| Ramp up Rate | 25-150° C. | <2.5° C./second | <1.04° C./second |
| Preheat | 25-217° C. | 2-4 minutes (4 minutes maximum) | 160 seconds |
| Soaking | 150-217° C. | 60-90 seconds (120 seconds maximum) | 64 seconds |
| Reflow | 217° C. | 60-75 seconds (90 seconds maximum) | 71.4 seconds |
| Peak | 255° C. | 235-255° C. | 254.9° C. |

FIB was then used to measure the coating thickness and study the continuity coating of each laminate from cross sections of the laminates. The OSP layer was determined to be continuous and uniform on all three laminates with a thickness of 120 nm on each laminate. The laminate that underwent 5× reflow cycles still had a continuous and uniform OSP thickness of 120 nm after reflow. A uniform and continuous OSP thickness of 110 nm was found on the laminate that underwent 11× thermal cycles.

Example 3

The process described in Example 2 was repeated except the OSPs used were 0.04 mol/L of 2,4-dipheyl-1H-imidazole formulation. Three OSP samples were tested.

One sample did not undergo reflow and had a continuous OSP thickness of 600 nm and was uniform. The second sample also had a continuous and uniform OSP thickness of 600 nm and the third sample had a continuous and uniform layer of 200 nm. After 5× reflow cycles the thickness of the second OSP sample was 500 nm, thus the OSP thickness did not significantly change from the laminate which was not reflowed; however, delamination of the OSP coating was observed. The third treated laminate after 11× reflow cycles had an OSP thickness of 170 nm which was continuous but not uniform. In addition, delamination of the OSP coating was observed.

Example 4

Eight FR-4 copper clad laminates were provided. Each laminate was cleaned using RONACLEAN™ LP-200 Acid Cleaner. Four of the laminates were treated with the OSP formulation and process of Example 2. The remaining four were left untreated and were used as controls. Three of the laminates which were treated with the OSP bath were passed through the reflow process. One was reflowed 3×, one at 5× and the third at 11×. The reflow conditions were the same as described in Example 2. One laminate which was treated with the OSP did not undergo any reflow processing. Three of the untreated laminates were also reflowed under the same conditions as the three OSP treated laminates. One was reflowed at 3×, another at 5× and the third at 11×.

The three control laminates which underwent reflow all showed severe discoloration of copper in comparison to the control unreflowed laminate. The discoloration was indicative of oxidation. The laminate which underwent 3× reflow had large patches of discoloration of the copper. The laminate which underwent 5× reflow was discolored over half of its surface and the most severe discoloration was observed in the laminate which was reflowed 11×. Substantially the entire surface was discolored. In contrast, all the laminates which were treated with the OSP had an observable coating of the OSP completely covering the copper surfaces and were substantially free of discoloration even after 11× reflow cycles. Accordingly, the OSP coating inhibited copper oxidation even under harsh reflow conditions and showed good thermal stability.

Example 5

The process described in Example 4 was repeated except that the OSP used was the 2,4-diphenyl-1H-imidazole formulation. Eight FR-4 copper clad laminates were treated. Six of the treated laminates were reflowed at 3×, 5× or 11×, two laminates per reflow cycle. The two laminates which did not undergo reflow did not appear discolored and the OSP covered the entire surface of the laminates. Minor discoloration was observed in one laminate which was treated with the formulation that underwent 3× reflow; however, the second laminate which underwent the 3× reflow cycle did not show any visible signs of oxidation. The laminates which underwent 5× reflow showed minor copper oxidation; however, the two laminates which underwent 11× reflow cycles showed significant copper oxidation. Accordingly, in comparison to the 2,4-diphenyl-1H-imidazole OSP formulation, the 1-H-imidazole[4,5-b]pyrazine OSP had better thermal stability.

Example 6

Twelve FR-4 copper clad laminates were provided. Three of the boards were treated with the OSP bath and method as in Example 2. Six laminates were treated with 0.04 mol/L 2,4-diphenyl-1H-imidazole according to the process described in Table 2 of Example 2. Three laminates were untreated, but two underwent 5× and 11× reflow. Six laminates treated with one of the two OSPs underwent 5× or 11× reflow cycles. One laminate treated with 1-H-imidazole[4,5-b]pyrazine did not undergo reflow and two laminates treated with 2,4-diphenyl-1H-imidazole did not undergo reflow. All of the laminates were then analyzed for thermal stability using ATR-FTIR to measure the size of the peak at 640 cm$^{-1}$, which is associated with copper oxidation. The greater the intensity of the peak is at 640 cm$^{-1}$ the greater is the copper oxidation. All three laminates which were not treated with one of the two OSPs showed the characteristic copper oxidation peak at 640 cm$^{-1}$ and the intensities of the peaks for the untreated laminates were greater than those of the laminates treated with one of the two OSP formulations. The intensity of this peak for all the laminates treated with the 2,4-diphenyl-1H-imidazole was greater for the four laminates which underwent reflow. The greatest intensity was observed for the two laminates that underwent 11× reflow cycles.

The laminates treated with the OSP bath containing 1-H-imidazole[4,5-b]pyrazine showed a peak at 635 cm$^{-1}$ due to the vibration of the pyrazine and indicative of some copper oxidation. There was a slight increase in peak intensity for the laminate which underwent 11× reflow. The oxidation of these three laminates was not as severe as with the laminates which went untreated and the laminates treated with 2,4-diphenyl-1H-imidazole. Therefore, the OSP bath which included 1-H-imidazole[4,5-b]pyrazine showed improved thermal stability over the untreated laminates and the laminates treated with the 2,4-diphenyl-1H-imidazole formulation.

Example 7

X-Ray photoelectron spectroscopy (XPS) was used to evaluate the elemental distribution in the coating and changes caused by thermal reflow. For bare copper clad laminates without any protective layer, the XPS results showed that oxygen can readily react with the surface to form a copper oxide layer after 5× reflow cycles. An effective protective layer prevented copper oxidation.

Eleven FR-4 laminates were provided to test the OSP bath containing 1-H-imidazole[4,5-b]pyrazine and its ability to inhibit oxygen penetration into copper against untreated and the OSP formulations containing 2,4-diphenyl-1H-imidazole. Two laminates were not treated with an OSP formulation. One was etched in an open air environment. The second was reflowed at 5× reflow cycles using the process disclosed in Example 2, Table 3 after etching. The oxygen content of the surface of the unreflowed laminate was measured to be 30 atomic % which indicated significant copper oxidation. The oxygen content within the copper layer was determined to be 1-5 atomic % indicating some copper oxidation. The laminate which underwent reflow had an oxygen content at its surface of 30 atomic % with an inner copper layer oxygen content of 25 atomic % indicating significant increased oxygen content after reflow and increased copper oxidation within the copper layer.

Three laminates were treated with the OSP bath of Table 1 in Example 2 and were processed by the method disclosed in Table 2 above. Two of the treated laminates were reflowed. One was reflowed at 5× and the other was reflowed at 11× cycles. The un-reflowed and the two reflowed laminates were etched and the atomic % oxygen content of each laminate was determined using XPS. The atomic oxygen content at the surface of the copper was determined to be 25 atomic % which indicated the formation of copper oxide at the surface. However, the oxygen content measured within the copper layers was determined to be 0 atomic %, thus there was no indication that copper oxide formed within the copper layers. In comparison to the control laminates, the OSP baths which included 1-H-imidazole[4,5-b]pyrazine prevented oxygen penetration into the copper surface, thus enabling the inhibition of copper oxidation.

The remaining six laminates were treated with 0.04 mol/L 2,4-diphenyl-1H-imidazole. Four were reflowed at either 5× or 11× cycles and two were not reflowed. The laminates which were not reflowed and the laminates that were reflowed at the 5× cycles showed no indication of oxygen penetration as measured by the XPS process. However, oxygen content within the copper layer increased from 5-8 atomic % for the two laminates which were reflowed for 11× cycles indicating copper oxide formation. Accordingly, the laminate which was treated with the 1-H-imidazole[4,5-b]pyrazine OSP and reflowed 11× had improved performance over the 2,4-diphenyl-1H-imidazole treated laminate reflowed 11×.

Example 8

Eighteen FR-4 copper clad laminates were provided to test the solderability performance of two OSP formulations. The solder fluxes used were either KESTER 979 (ORL0) or KESTER 985 M (ROL0). The solder which was used on each laminate was SAC 305 solder which was composed of 96% tin, 3.5% silver and 0.5% copper obtained from Nihon Superior SN97C. One formulation had the composition as disclosed in Table 1 of Example 2 and the other formulations included 0.04 mol/L 2,4-dipheyl-1H-imidazole. Six laminates were treated with the 1-H-imidazole[4,5-b]pyrazine OSP and twelve were treated with 2,4-dipheyl-1H-imidazole. The treatment process was the same as disclosed in Table 2 of Example 2 above. The laminates were treated with one of the two OSPs and were fluxed with one of the two fluxes. Six laminates were inserted into solder pots at 255° C. to coat the laminates with solder. All of the laminates were 100% covered with solder; however, the wetting performance of the laminates treated with the 2,4-dipheyl-1H-imidazole OSPs showed better wetting performance. This was determined by the smooth appearing solder coating the laminates treated with 2,4-dipheyl-1H-imidazole. In contrast, the two laminates which were coated with 1-H-imidazole[4,5-b]pyrazine had a rough appearing solder surface.

The remainder of the laminates was reflowed after application of one of the two OSPs prior to solder application. Six were reflowed for 5× and the other six were reflowed for 11×. After reflow the laminates were fluxed with one of the two fluxes followed by coating with solder. The four laminates treated with the OSP which included 1-H-imidazole[4,5-b]pyrazine showed better wetting performance. Both laminates reflowed for 5× had 100% solder coverage. One laminate reflowed for 11× also had 100% solder coverage while the other laminate which was fluxed with KESTER 985M had 95% coverage. In addition the solder coverage appeared smooth.

In contrast, one laminate treated with the 2,4-dipheyl-1H-imidazole OSP and reflowed for 5× showed 90% solder coverage for the KESTER 979 solder and one 70% coverage for the KESTER 985M solder. Another laminate treated with the KESTER 979 flux had 100% coverage; however, one laminate treated with the KESTER 985M had only 80% coverage. One laminate reflowed for 11× and treated with the KESTER 979 had 80% coverage and one laminate treated with the KESTER 985M had only 15% coverage. One laminate reflowed for 11× and treated with the KESTER 979 flux had 70% coverage and another laminate treated with the KESTER 985M flux had only 10% coverage. The reduced solder coverage of the laminates treated with the 2,4-dipheyl-1H-imidazole OSPs indicated deterioration of the OSP coatings and increased oxygen content of the OSP layer which compromised solder coverage. Accordingly, the OSP baths which included 1-H-imidazole[4,5-b]pyrazine showed improved solder coverage after reflux compared to the conventional 2,4-dipheyl-1H-imidazole OSPs thus indicating reduced oxygen content in the 1-H-imidazole[4,5-b]pyrazine OSP layers.

What is claimed is:

1. Compositions comprise one or more sources of metal ions chosen from copper salts, tin salts, zinc salts, silver salts, nickel salts, lead salts, barium salts, manganese salts, iron salts and palladium salts, one or more acids and one or more compounds having formulae:

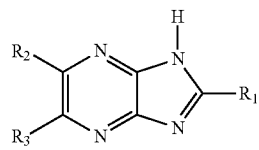

wherein $R_1$, $R_2$ and $R_3$ are independently hydrogen, halide, nitro, hydroxyl, cyano, substituted or unsubstituted, linear, branched or cyclic hydrocarbyl, substituted or unsubstituted, linear or branched alkoxyl, carboxyl, ester, mercapto, alkylthio, thioester, amino, amide, boryl or silyl; $R_1$ and $R_2$ may be taken together with all of their atoms to form a five membered heterocyclic ring wherein the heterocyclic ring includes two nitrogen atoms as the hetero-atoms; and $R_1$ can have the following structure:

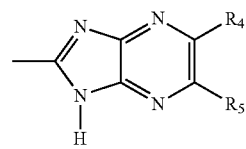

wherein $R_4$ and $R_5$ are independently hydrogen, halide, nitro, hydroxyl, cyano, substituted or unsubstituted, linear, branched or cyclic hydrocarbyl, substituted or unsubstituted, linear or branched alkoxyl, carboxyl, ester, mercapto, alkylthio, thioester, amino, amide, boryl or silyl; $R_4$ and $R_5$ may be taken together with all of their atoms to form a five membered heterocyclic ring wherein the heterocyclic ring includes two nitrogen atoms as the hetero-atoms.

2. The composition of claim 1, wherein the one or more compounds are included in the composition in amounts of 0.5 g/L to 15 g/L.

3. The composition of claim 1, wherein the one or more sources of metal ions are included in the composition in amounts of 0.001 g/L to 5 g/L.

4. A method comprising:
a) providing a substrate comprising copper or copper alloy; and
b) contacting the substrate with a composition including one or more sources of metal ions chosen from copper salts, tin salts, zinc salts, silver salts, nickel salts, lead salts, barium salts, manganese salts, iron salts and palladium salts, one or more acids and one or more compounds having structure:

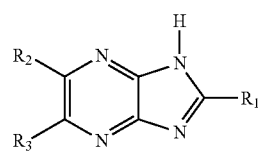

wherein $R_1$, $R_2$ and $R_3$ are independently hydrogen, halide, nitro, hydroxyl, cyano, substituted or unsubstituted, linear, branched or cyclic hydrocarbyl, substituted or unsubstituted, linear or branched alkoxyl, carboxyl, ester, mercapto, alkylthio, thioester, amino, amide, boryl or silyl; $R_2$ and $R_3$ may be taken together with all of their atoms to form a five membered heterocyclic ring wherein the heterocyclic ring includes two nitrogen atoms as the hetero-atoms; and $R_1$ may have the following structure:

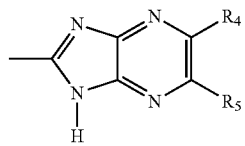

wherein $R_4$ and $R_5$ are independently hydrogen, halide, nitro, hydroxyl, cyano, substituted or unsubstituted, linear, branched or cyclic hydrocarbyl, substituted or unsubstituted, linear or branched alkoxyl, carboxyl, ester, mercapto, alkylthio, thioester, amino, amide, boryl or silyl; $R_4$ and $R_5$ may be taken together with all of their atoms to form a five membered heterocyclic ring wherein the heterocyclic ring includes two nitrogen atoms as the hetero-atoms to form a coating on the copper or copper alloy of the substrate.

5. The method of claim 4, wherein the substrate is a printed circuit board.

* * * * *

UNITED STATES PATENT AND TRADEMARK OFFICE
CERTIFICATE OF CORRECTION

| | |
|---|---|
| PATENT NO. | : 8,961,678 B2 |
| APPLICATION NO. | : 13/722768 |
| DATED | : February 24, 2015 |
| INVENTOR(S) | : Qin Tang et al. |

It is certified that error appears in the above-identified patent and that said Letters Patent is hereby corrected as shown below:

In the specification,

Column 3, line 18 replace $R_2$ with $R_3$

Column 5, line 14 replace $R_2$ with $R_3$

In the claims,

Claim 1, Column 14, line 15 replace $R_2$ with $R_3$

Signed and Sealed this
Twenty-ninth Day of December, 2015

Michelle K. Lee
*Director of the United States Patent and Trademark Office*